United States Patent
Yao et al.

(10) Patent No.: US 11,031,796 B2
(45) Date of Patent: Jun. 8, 2021

(54) SHORT CIRCUIT AND SOFT SHORT PROTECTION FOR DATA INTERFACE CHARGING

(71) Applicant: Dialog Semiconductor Inc., Campbell, CA (US)

(72) Inventors: Jianming Yao, Campbell, CA (US); Kai-Wen Chin, Campbell, CA (US); Yong Li, Campbell, CA (US); Cong Zheng, Campbell, CA (US); David Nguyen, Campbell, CA (US); Fuqiang Shi, Campbell, CA (US)

(73) Assignee: DIALOG SEMICONDUCTOR INC., Campbell, CA (US)

( * ) Notice: Subject to any disclaimer, the term of this patent is extended or adjusted under 35 U.S.C. 154(b) by 808 days.

(21) Appl. No.: 15/604,515

(22) Filed: May 24, 2017

(65) Prior Publication Data

US 2017/0346313 A1    Nov. 30, 2017

Related U.S. Application Data

(60) Provisional application No. 62/341,606, filed on May 25, 2016.

(51) Int. Cl.
  *H02J 7/00* (2006.01)
  *H02M 1/32* (2007.01)
  *H02M 3/335* (2006.01)
  *G01R 31/50* (2020.01)

(52) U.S. Cl.
  CPC .......... *H02J 7/0029* (2013.01); *G01R 31/50* (2020.01); *H02J 7/0072* (2013.01); *H02M 1/32* (2013.01); *H02M 3/33523* (2013.01); *H02J 7/00* (2013.01); *H02J 7/00034* (2020.01)

(58) Field of Classification Search
  CPC .......... H02J 7/0029; H02J 7/0072; H02J 7/00; H02J 7/00034; G01R 31/50; G01R 31/52; H02M 1/32; H02M 3/33523; H02M 3/33561; H02M 3/33592; H02M 7/219; H02H 7/1213
  USPC .......................................................... 307/104
  See application file for complete search history.

(56) References Cited

U.S. PATENT DOCUMENTS

| | | | |
|---|---|---|---|
| 2007/0080675 A1* | 4/2007 | Gray | H02M 3/156 323/282 |
| 2016/0190938 A1* | 6/2016 | Wang | H02M 3/33507 363/21.12 |
| 2016/0308452 A1* | 10/2016 | Motoki | H02J 7/022 |
| 2016/0352232 A1* | 12/2016 | Chang | G06F 1/266 |

FOREIGN PATENT DOCUMENTS

| | | |
|---|---|---|
| CN | 1153413 | 7/1997 |
| CN | 103442501 | 12/2013 |
| CN | 104578826 | 4/2015 |
| WO | WO 2016/045001 | 3/2016 |

* cited by examiner

*Primary Examiner* — Rexford N Barnie
*Assistant Examiner* — Xuan Ly
(74) *Attorney, Agent, or Firm* — Haynes and Boone, LLP

(57) ABSTRACT

A switching power converter is provided that communicates with a mobile device to receive a value of a load detection current. The switching power converter adjusts the cycling of a power switch until a constant current mode of operation is entered with a known output current driving the mobile device. The switching power converter subtracts the load current from the output current to measure a soft-short circuit current.

16 Claims, 6 Drawing Sheets

SHORT CIRCUIT AND SOFT SHORT PROTECTION FOR DATA INTERFACE CHARGING

CROSS-REFERENCE TO RELATED APPLICATIONS

This application claims priority to U.S. Provisional Application No. 62/341,606, filed May 25, 2016, which is incorporated by reference in its entirety.

TECHNICAL FIELD

This application relates to power converters, and more particularly to a switching power converter configured to detect a soft short condition while charging a battery-powered device through a data interface cable.

BACKGROUND

The growth in mobile electronic devices such as smartphones and tablets creates an increasing need in the art for compact and efficient switching power converters so that users may recharge these devices. A flyback switching power converter is typically provided with the sale of a mobile device as the transformer of the power converter provides safe isolation from AC household current. In addition, such devices are often used with a DC/DC converter such as a car charger. It is conventional for the switching power converter to couple to the device being charged through a standard data interface such as a Universal Serial Bus (USB) interface. The USB interface includes a differential pair of signals (D+ and D−) for data signaling and also provides power and ground. USB Type C interface has additional communication signals such as configuration channel (CC1 and CC2) for USB Power Delivery. With regard to the delivery of power, a USB cable can only provide a certain amount of current. For example, the USB 2.0 standard allows for a maximum output current of 500 mA whereas the USB 3.0 standard supports a maximum output current of 900 mA. USB Type C supports default 3 A and maximum 5 A with E-marker IC. Traditionally, the delivery of power through a USB cable used a voltage of 5.0 V. But modern mobile device batteries typically have a storage capacity of several thousand milliamps. The charging of such batteries, even at the increased output currents allowed in the USB 3.0 standard for Type A (e.g USB A) and Type B (e.g. USB micro B, would thus be delayed if the power is delivered using a 5 volt power supply voltage. This is particularly true in that the switching power supply, the cable, and the receiving device all present a resistance to the output current.

To enable a rapid charge mode in light of the output current limitations and also the associated losses from device resistances, it is now becoming conventional to use markedly higher output voltages over the USB cable. For example, rather than use the conventional USB output voltage of 5 V, rapid charging modes have been developed that use 9 V, 12 V, or even 19 V. The increased voltages allow the switching power supply to deliver more power over the USB cable without exceeding the maximum output current limitations. However, many legacy devices can only support the standard 5 V from a USB cable. A rapid-charge switching power supply will thus engage in an enumeration process with the device being charged to determine if the higher output voltages are supported. This enumeration may occur over the differential D+ and D− pins. Through the enumeration, the switching power converter and the enumerated device may change the USB output voltage to an increased level that is supported by the enumerated device. The result is considerably reduced charging time, which leads to greater user satisfaction.

Although rapid charging modes are thus advantageous, problems have arisen in their implementation. For example, the USB cable may get dirty such that a dust particle or other slightly conductive object couples between the VCC pin (the pin delivering the output power) and GND (ground) pin such that a slightly conductive path exists between the VCC pin/wire and the GND pin/wire. The result is a "soft short" between VCC and ground. It is denoted as a soft short in that the impedance for the coupling between the corresponding pins (or wires) is relatively high compared to a true short circuit. In that regard, it is conventional for a switching power converter driving a USB interface to include an over-current protection circuit that will shut down the charging through the USB interface if a short circuit is detected. In this fashion, the maximum output current levels for the USB interface are not exceeded. But a soft short will not result in such a large increase in current. A conventional switching power converter with overcurrent protection will thus not respond to a soft short in that the increase in output current is negligible or minor such that it does not trigger an over-current state.

This lack of response is problematic in that users will often leave a USB cable connected to the switching power converter after removing their portable device. The switching power converter will then waste power by driving the soft short in the cable, which reduces system reliability and safety. Moreover, even if the user removes the cable, the USB interface on the switching power converter itself may be contaminated with dust so as to still experience a soft short.

Accordingly, there is a need in the art for improved power converters that protect against soft shorts over data interfaces used to deliver power.

SUMMARY

To detect faults such as a soft short circuit, a flyback switching power converter is provided that distinguishes any short circuit current that is present (either a short circuit or a soft short) from a normal operating current in order to be able to detect a short circuit condition on a data cable that is also used for charging battery-powered devices. For example, the data cable may comprise a universal serial bus (USB) cable, a mini-USB cable, or an Apple Lightning cable.

The flyback converter disclosed herein is configured to implement a soft circuit detection mode in which the mobile device draws a known amount of load current denoted herein as $ILOAD_{DET}$. The flyback converter then measures its output current (IOUT) and determines the difference between IOUT and $ILOAD_{DET}$ to measure the soft short circuit current (ISHORT). Should ISHORT exceed a threshold level, the flyback converter detects a soft short condition and alerts the mobile device accordingly through the data channel in the data cable. The measurement of the output current IOUT may be performed in the primary-side of the flyback converter's transformer or at the secondary-side of the transformer. In both cases, the measurement involves the use of a sense resistor. But note that the current through a primary-side sense resistor is generally much lower than the current through a secondary-side sense resistor due to the turn ratio of the transformer such that the resistance power loss in the primary-side sense resistor is much lower. The following discussion will thus focus on a primary-side measurement of the output current from the flyback converter but it will be appreciated that the soft-short circuit detection techniques disclosed herein may also be implemented using a secondary-side sense resistor.

As is well known in the flyback converter arts, the primary side and the secondary side of the transformer do not share a ground. This isolation between the primary and secondary sides in a flyback converter presents an obstacle to communication between the primary and secondary controllers. Prior to the development of charging through a data interface such as a USB cable, there was no need for such communication such that a flyback converter would not include a secondary-side controller. But as discussed earlier, the development of fast-charge techniques requires an enumeration process between the flyback converter and the mobile device that may occur over the data channel in the data cable coupling the flyback converter to the mobile device. Since the primary-side controller is isolated from the data channel, such enumeration requires a secondary-side controller. Although the secondary-side controller may directly communicate with the mobile device through the data cable, it then requires a means for transmitting the resulting desired output voltage to the primary-side controller despite the ground isolation. For example, the flyback converter may include an isolated data channel such as an optocoupler or a capacitor over which the secondary-side controller and the primary-side controller may communicate. Alternatively, the controllers may communicate using primary-only techniques. In such primary-only techniques, the secondary-side controller pulses a drain voltage for the primary-side power switch transistor by temporarily shorting out the output diode. Alternatively, if the secondary-side of the flyback converter uses a synchronous rectifier (SR) switch instead of an output diode, the secondary-side controller pulses the drain voltage by pulsing the SR switch closed.

The primary-side controller may similarly pulse the power switch closed to transmit data to the secondary-side controller. Regardless of whether an isolated data channel such as an optocoupler or primary-only techniques are used, the secondary-side controller may then transmit the mobile device's load current $ILOAD_{DET}$ to the primary-side controller. The primary-side controller may then determine the output current TOUT from the flyback converter so as to measure the soft-short current (if present) by determining the difference between IOUT and $ILOAD_{DET}$. The measurement of the output current by the primary-side controller involves a constant-current regulation of the power switch cycling. In that regard, it is well known that a primary-side controller may regulate the power switch cycling in either a constant-voltage mode of regulation or in a constant-current mode of regulation. With regard to these modes of regulation, if the output voltage is going to exceed the output voltage limit, the ensuing regulation is in the constant-voltage mode. Conversely, if the output voltage cannot reach the desired output voltage, the primary-side controller regulates the power switch cycling in the constant-current mode.

With regard to the desired output voltage and output current limits, they define a transition point between the constant-voltage and constant-current modes of operation. If the output current drops below the output current limit, the flyback converter operates in the constant-voltage mode whereas it operates in the constant-current mode if the output voltage drops below the output voltage limit. In the constant-current mode of operation, the output current driven into the data cable from the flyback converter equals kcc/2*Npri/Nsec/Rs, where kcc is a coefficient for the constant current limit, Npri/Nsec is the transformer primary-side-to-secondary-side turns ratio, and Rs is the current sense resistor in series with the power switch transistor. The primary-side controller is configured to alter the kcc coefficient to force the flyback converter into the constant-current mode. In particular, the primary-side controller knows the amount of current $ILOAD_{DET}$ that is being drawn by the load. During an initial portion of the soft-short detection phase of operation, the primary-side controller may thus begin operation with a kcc coefficient that corresponds to an output current limit that equals $ILOAD_{DET}$ plus some initial amount so that operation proceeds in the constant-voltage mode initially. The primary-side controller may then progressively reduce the kcc coefficient until it regulates in the constant-current mode of operation. The primary-side controller thus may calculate the output current using the equation discussed above when the constant-current mode of operation is achieved. If this output current is greater than the $ILOAD_{DET}$ by some threshold amount, a soft-short circuit is detected.

The resulting soft short detection is quite advantageous as it protects against soft-short conditions that cannot be detected through conventional over-current threshold techniques. In particular, the relatively high impedance of a soft-short circuit results in a relatively small amount of current being conducted that does not trigger an over-current threshold. But the resulting soft-short circuit is detected through the flyback converter controller described herein.

These advantageous features may be better appreciated from the detailed description below.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
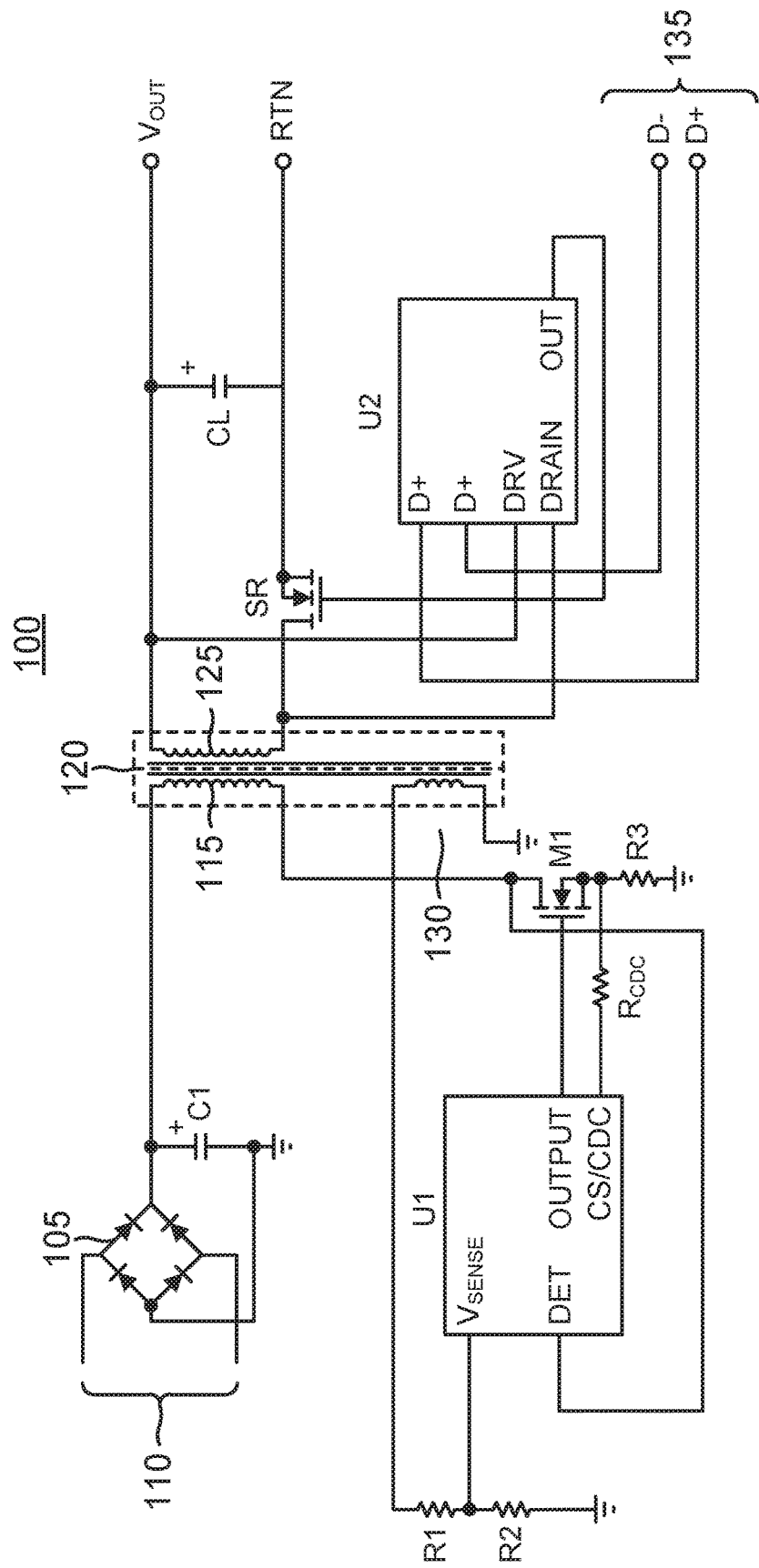
FIG. 1 is a diagram of an example flyback converter with synchronous rectification and including a secondary-side controller configured to detect soft short circuits in accordance with an aspect of the disclosure.

An improved fault monitor is provided for switching power converters used to charge mobile devices through data interfaces such as a Universal Serial Bus (USB) cable, a mini-USB cable, a micro-USB cable, or an Apple Lightning cable. The following discussion will assume that the cable interface is a Universal Serial Bus (USB) interface but it will be appreciated that any interface that combines power delivery with data signaling may be protected as discussed herein. The following discussion will be directed to a flyback converter embodiment, but it will be appreciated that the fault monitor may be widely applied to other types of switching power converters such as buck or boost converters.

A flyback converter is disclosed that includes a secondary-side controller configured to monitor the data pins in the data interface cable so as to communicate with a device such as a mobile device coupled to the data interface cable. During a soft-short detection mode of operation, the mobile device communicates an ILOAD profile to the secondary-side controller through the data channel in the data interface cable. The ILOAD profile may include, for example, a desired voltage to be used for charging the load device and a load current ($ILOAD_{DET}$) to be drawn by the device at the desired voltage. The flyback converter is configured to measure its output current (IOUT) while it operates in the constant-current mode and the mobile device draws the load current $ILOAD_{DET}$. By determining the difference between IOUT and $ILOAD_{DET}$ the flyback converter measures the soft-short current (ISHORT). Should ISHORT exceed a threshold amount, the secondary-side controller in the flyback converter notifies the mobile device of the soft-short detection.

There are two main embodiments with regard to how the flyback converter measures the output current IOUT. In a first embodiment, the secondary winding for the flyback converter transformer is in series with a secondary-side sense resistor. The secondary-side controller monitors the voltage across the secondary-side sense resistor and measures IOUT through Ohm's law. But such a sense resistor introduces substantial efficiency loss due to its resistance. The resulting power loss is substantially avoided in a second embodiment in which the primary-side controller measures IOUT while it regulates the power switch cycling in a constant-current mode of operation. In particular, the primary-side controller may determine IOUT using the constant-current mode equation of operation in which IOUT equals kcc/2*Npri/Nsec/Rs, where kcc is the coefficient for the constant current limit, Npri/Nsec is the transformer primary-side-to-secondary-side turns ratio, and Rs is the resistance for the primary-side current sense resistor in series with the power switch transistor and the primary winding. The primary-side controller is configured to alter the kcc coefficient to force the flyback converter into the constant-current mode. In particular, the primary-side controller knows the amount of current $ILOAD_{DET}$ that is being drawn by the load since it receives this information from the secondary-side controller. During an initial portion of the soft-short detection phase of operation, the primary-side controller may thus begin operation with a kcc coefficient that corresponds to an output current limit that equals $ILOAD_{DET}$ plus some initial amount so that operation proceeds in the constant-voltage mode initially. The primary-side controller may then progressively reduce the kcc coefficient until it regulates in the constant-current mode of operation. The primary-side controller thus may calculate the output current using the equation discussed above when the constant-current mode of operation is achieved. If this output current is greater than the $ILOAD_{DET}$ by some threshold amount, a soft-short circuit is detected. The initial kcc coefficient thus has a magnitude such that IOUT corresponding to the initial kcc coefficient in the constant-current mode is greater than $ILOAD_{DET}$ plus the threshold for the soft-circuit detection. The primary-side controller may then "hunt" for the resulting IOUT in which it operates in constant-current mode by progressively reducing the kcc coefficient until constant-current mode operation is achieved. The primary-side controller then knows the magnitude of IOUT using the equation discussed above. Should IOUT exceed $ILOAD_{DET}$ by the threshold amount, the primary-side controller detects a soft-short circuit condition and notifies the secondary-side controller accordingly. The secondary-side controller may then notify the mobile device of the soft-short condition through the data channel in the data interface cable.

In an alternative embodiment, communication between the flyback converter and the mobile device can be used to set $ILOAD_{DET}$ to zero so that the device being charged draws no current at the voltage supplied by the switching power converter (e.g., no-load condition). The power converter can then monitor its output voltage to determine whether the voltage droop rate for the output voltage exceeds a pre-determined threshold during the no-load condition. If so the switching power converter can determine that a soft short-circuit fault exists. This embodiment can be useful, for example, in conditions where the leakage current (e.g., a soft short current in the cable or connector assembly) is too small for the power converter to enter into CC mode operation as described above.

An example flyback power converter 100 is shown in FIG. 1. A bridge rectifier 105 rectifies an AC input voltage from an AC mains 110 and outputs the resulting rectified input voltage into an input capacitor C1. This rectified input voltage drives a magnetizing current into a primary winding 115 of a transformer 120 when a power switch such as an NMOS power switch transistor M1 is driven on by a primary-side controller U1. In a constant-voltage mode, the primary-side controller U1 modulates the cycling of the power switch M1 to maintain a DC value for an output voltage $V_{OUT}$ produced at a secondary winding 125 of transformer 120 at a desired voltage. Since the primary-side controller U1 is isolated from a USB cable having a pair of a D+ and a D− data pins received at a cable interface 135, a secondary-side controller U2 interfaces with the mobile device being charged (not illustrated) through the data terminals. In flyback power converter 100, secondary-side controller U2 controls the cycling of a synchronous rectifier (SR) switch transistor such as an NMOS transistor. The secondary-side controller U2 switches on the SR switch transistor in response to primary-side controller U1 switching off the power switch M1. The resulting synchronous rectification is conventional and improves efficiency over the use of a output diode on the secondary side. It will be appreciated, however, that the advantageous soft-circuit detection techniques and systems disclosed herein may be practiced without synchronous rectification in alternative embodiments in which the SR switch transistor is replaced by an output diode as discussed further below.

An auxiliary winding 130 for transformer 120 couples to ground through a voltage divider formed by a serial pair of resistors R1 and R2 to produce a sense voltage $V_{SENSE}$ that is received by primary-side controller U1. For example, primary-side controller U1 may sample $V_{SENSE}$ at the transformer reset time to sense the output voltage. To modulate the output voltage in response to this sensing, primary-side controller U1 may adjust the frequency or pulse width for the cycling of power switch M1. For example, primary-side controller U1 may monitor the magnetizing current magnitude (CS) through a voltage divider formed by a primary-side sense resistor R3 and a cable drop compensation resistor ($R_{CDC}$) coupled to the source of power switch transistor M1. When the current magnitude CS reaches a desired level for a given power switching cycle, primary-side controller U1 may proceed to switch off power switch transistor M1.

Secondary-side controller U2 may be configured to monitor the voltage on the D+ terminal and D− terminal to determine if a load such as a mobile device is attached to another end of the USB cable. In FIG. 1, the data interface cable is represented by an output voltage terminal VOUT, a ground terminal RTN, and the data terminals. In response to detecting that the mobile device is attached to the data interface cable, secondary-side controller U2 may enumerate the attached device, for example, to determine if the mobile device supports a rapid-charge mode of operation in which the output voltage may be increased from a nominal level such as 5 V to a higher level such as 12 V or 19 V. Secondary-side controller U2 may then signal the enumeration data (e.g., load profile data) to primary-side controller U1 by using a primary side only signaling based on pulsing the SR switch transistor on after the transformer reset time and before the next power switch on time. Load capacitor CL couples between the output voltage node ($V_{OUT}$) and ground (RTN) to smooth the output voltage. Primary-side controller U1 detects the reflected voltage on the drain of power switch M1 as a detect voltage to the DET terminal of primary-side controller U1 that can be subjected to primary side only signaling techniques to receive data from the secondary-side controller U2 that it received through the data terminals. For example, secondary-side controller U2 may receive and signal to primary-side controller U1, using this technique, the amount of load current ($I\_LOAD_{DET}$) the device being charged (not illustrated) will draw from the power converter during a detection period.

In an alternative embodiment, an isolated communication channel such as an optoisolator or a capacitor could be used to communicate data from U2 to U1. For example, secondary-side controller U2 may signal the enumeration or load profile data to primary-side controller U1 by grounding a first side of an optocoupler as represented by a communication channel (comm) shown in FIG. 2. Primary-side controller U1 may detect the voltage change across a second side of the optocoupler (not shown) to receive the data. Referring again to FIG. 1, secondary-side controller U2 monitors the drain voltage (DRAIN) of the SR switch transistor to control when to switch on and off the SR switch transistor. While the power switch M1 is conducting, the drain voltage for the SR switch transistor will be grounded or near zero but will then swing high when the power switch M1 is cycled off. As known in the synchronous rectification arts, secondary-side controller U2 responds to this voltage change by charging the gate of the SR switch transistor through an OUT terminal to switch the SR switch transistor on. Due to the relatively-low on resistance of the SR switch transistor, the resulting synchronous rectification saves power as compared to the use of a secondary-side diode.

Figure 2:
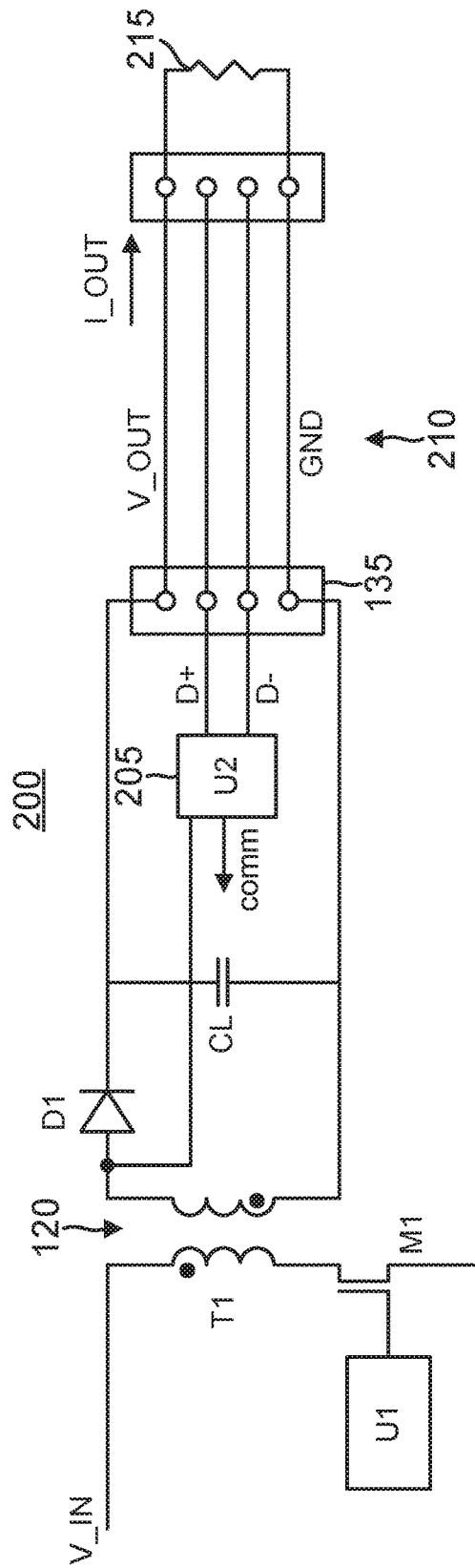
FIG. 2 is a diagram of an example flyback converter without synchronous rectification and including a secondary-side controller configured to detect soft short circuits in accordance with an aspect of the disclosure.

The soft-short circuit detection techniques and systems disclosed herein include embodiments in which a diode replaces the SR switch transistor. An example flyback converter 200 is shown in FIG. 2 that includes a rectifying diode D1 on the secondary side to perform the function of the SR switch transistor. Primary-side controller U1, power-switch M1, transformer 120, load capacitor CL, and cable interface 135 operate as discussed with regard to flyback converter 100. The primary side only signaling (or signaling through an isolating device such as an optocoupler) between a secondary-side controller 205 and primary-side controller U1 is represented by a "comm" (communication) signal. A user has detached a mobile device from a data interface cable 210 but left data interface cable 210 still attached to cable interface 135. A soft-short circuit 215 causes a non-zero output current I_OUT to flow from the V_OUT terminal to the ground (GND) terminal in cable interface 135.

Secondary-side controller 205 may be configured to signal load profile data and initiation of a soft-short detection mode to primary-side controller U1 by using the data channel (comm). For example, secondary-side controller 205 may receive on the data terminals the amount of load current ($I\_LOAD_{DET}$) the device being charged (not illustrated) will draw from the flyback converter during the soft-short detection period. Secondary-side controller 205 may then transmit the load current value to primary-side controller U1 through the data channel (comm).

Figure 3:
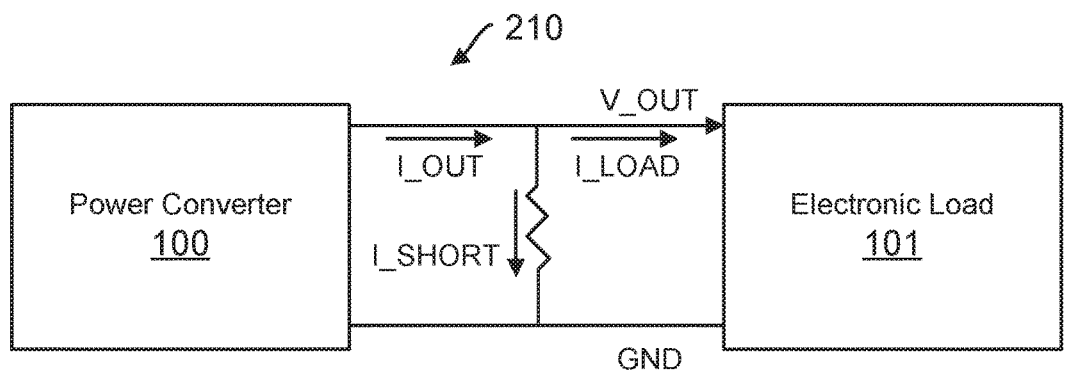
FIG. 3 is a diagram of an example power converter and electronic load illustrating the relationships between certain variables and parameters in accordance with an aspect of the disclosure.

FIG. 3 illustrates the bifurcation of the output current I_OUT from a switching power converter such as a flyback converter 100 into a load current I_LOAD driven into an electronic load 101 (e.g., a mobile phone) via conductors of data interface cable 210. In the presence of a soft-short current I_SHORT, I_OUT splits into I_SHORT and I_LOAD, as shown, and I_LOAD is the current provided to electronic load 101. Flyback converter 100 may thus provide a regulated output voltage V_OUT to the electronic load 101 (neglecting the conduction losses in data interface cable 210) and also a regulated output current I_OUT.

Figure 4:
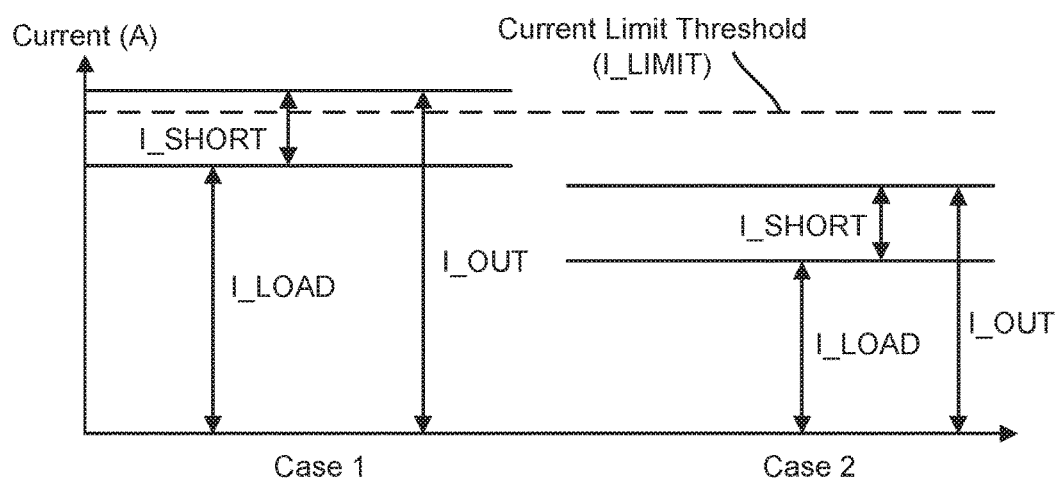
FIG. 4 is a pair of current graphs comparing two example cases in accordance with an aspect of the disclosure.

The soft-short detection mode disclosed herein advantageously detects soft-short conditions that the conventional use of a current threshold could not. For example, FIG. 4 illustrates in a first case (Case 1), a conventional power converter detecting a short-circuit condition by comparing I_OUT to a current limit threshold, I_LIMIT. In Case 1, a short circuit condition is detected when I_SHORT+ I_LOAD>I_LIMIT. But such a current threshold can only detect relatively robust short circuits that exceed the current limit threshold. As shown in a Case 2, however, there are conditions where a short circuit condition is not detected using a current limit threshold. For example, when there exists a high impedance short circuit (otherwise referred to as a soft short condition) where I_SHORT+ I_LOAD<I_LIMIT, a conventional switching power converter will not detect a fault condition using a current limit threshold, even though there is a non-zero amount of I_SHORT current, as shown. The negative impact of not detecting such a fault condition includes increased power dissipation and increased operating temperature, resulting in lower operating efficiency and reduced system reliability. Furthermore, battery operated portable devices typically employ a separate power converter (charger), detachable charging cable and interconnection system (e.g. USB cable), and portable device. Often, normal wear and tear of the USB charging cable and foreign particles in the USB connector assembly create soft short circuits, resulting in sub-optimal operation.

Instead of using an output current limit I_LIMIT, the soft-short detection mode disclosed herein compares the soft-short current I_SHORT to a threshold. Once I_SHORT is distinguished from I_LOAD as discussed herein, a precise measure of the short circuit current I_SHORT can be made. In an alternative embodiment, once a determination is made that the secondary controller U2 is in a no load condition, a precise measure of any short circuit current I_SHORT can be made using a measurement of voltage droop for the output voltage.

Figure 5:
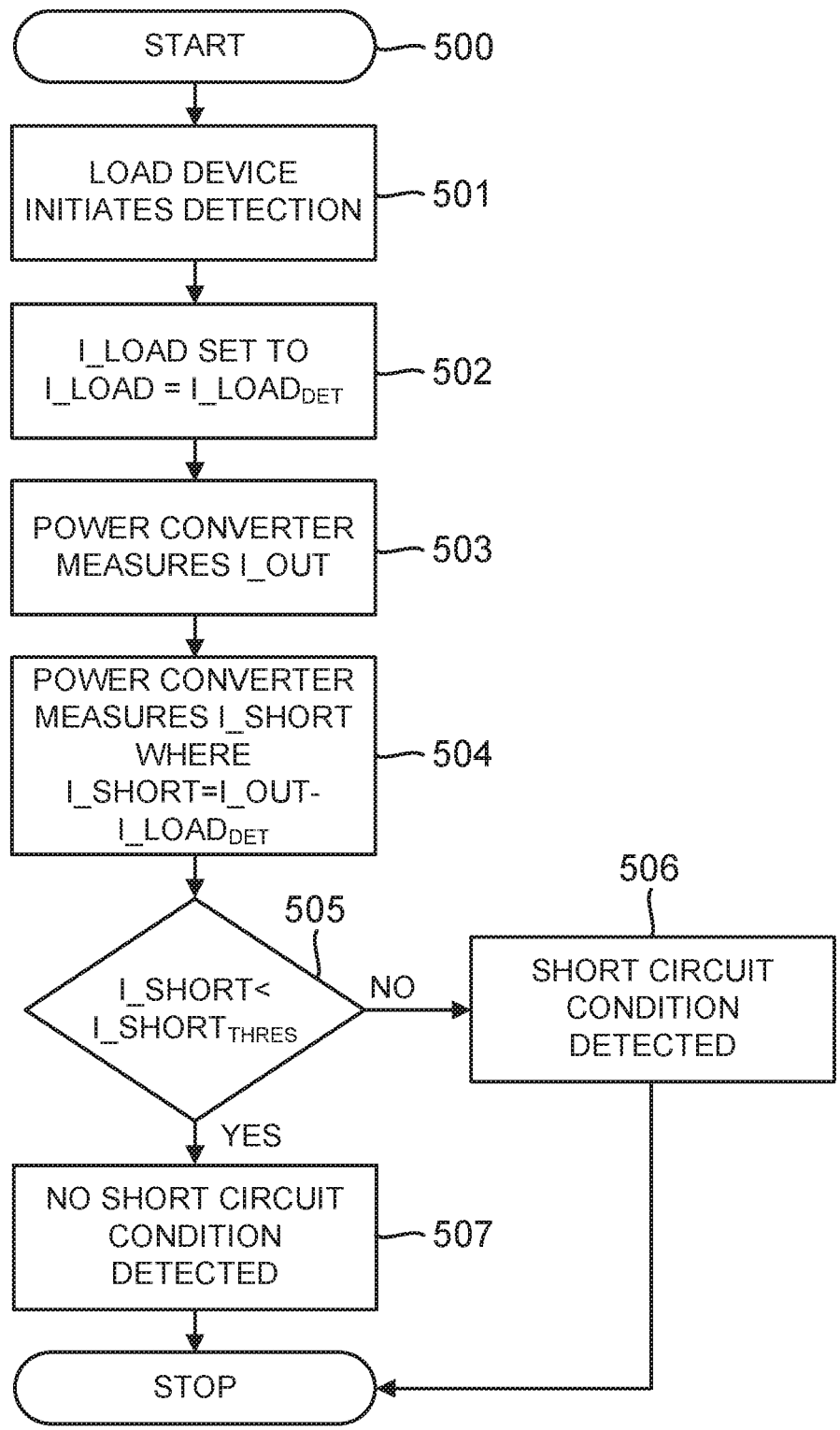
FIG. 5 is a flowchart of an example method, in accordance with an aspect of the disclosure, of detecting a soft-short condition in a data cable driven by a switching power converter

A method of operation for a soft-short detection will now be discussed with regard to the flowchart of FIG. 5. The method 500 includes an act 501 of initiating the soft-short detection mode by receiving the load profile from the load device. For example, the electronic device 101 may broadcast to the flyback converter 100 the amount of load current, I_LOAD it will draw from the flyback converter during the detection period, referred to as $I\_LOAD_{DET}$, and a target voltage V_OUT. $I\_LOAD_{DET}$ may be any known value of the normal operating range of the power converter. For example, $I\_LOAD_{DET}$ can be near the minimum load range so that $I\_LOAD_{DET}$ will be relatively low as set in an act 502.

In an act 503, the flyback converter 100 measures the amount of output current I_OUT it is delivering to the data interface cable. For example, operating in constant current mode, the switching power converter adjusts the constant voltage to constant current transition point such that the power converter operates in CC mode at the value I_OUT. The primary-side controller may then measure I_OUT using the constant-current equation discussed above. Because both I_OUT and $I\_LOAD_{DET}$ are known to the flyback converter, the short circuit current (I_SHORT) can be determined, in an act 504, by the equation $I\_SHORT = I\_OUT - I\_LOAD_{DET}$.

In an act 505, I_SHORT is compared to a soft-short-circuit current threshold ($I\_SHORT_{THRESH}$) to determine if a short circuit condition (including a soft short condition) exists. In particular, act 505 determines if I_SHORT is less than $I\_SHORT_{THRESH}$.

In the comparison indicates that I_SHORT is greater than $I\_SHORT_{THRESH}$, a soft-short circuit condition is detected in an act 506 so that appropriate action may be taken, such as shutting down the power converter. If the comparison is negative as detected in an act 507, no soft-short circuit condition is deemed to exist.

Figure 6:
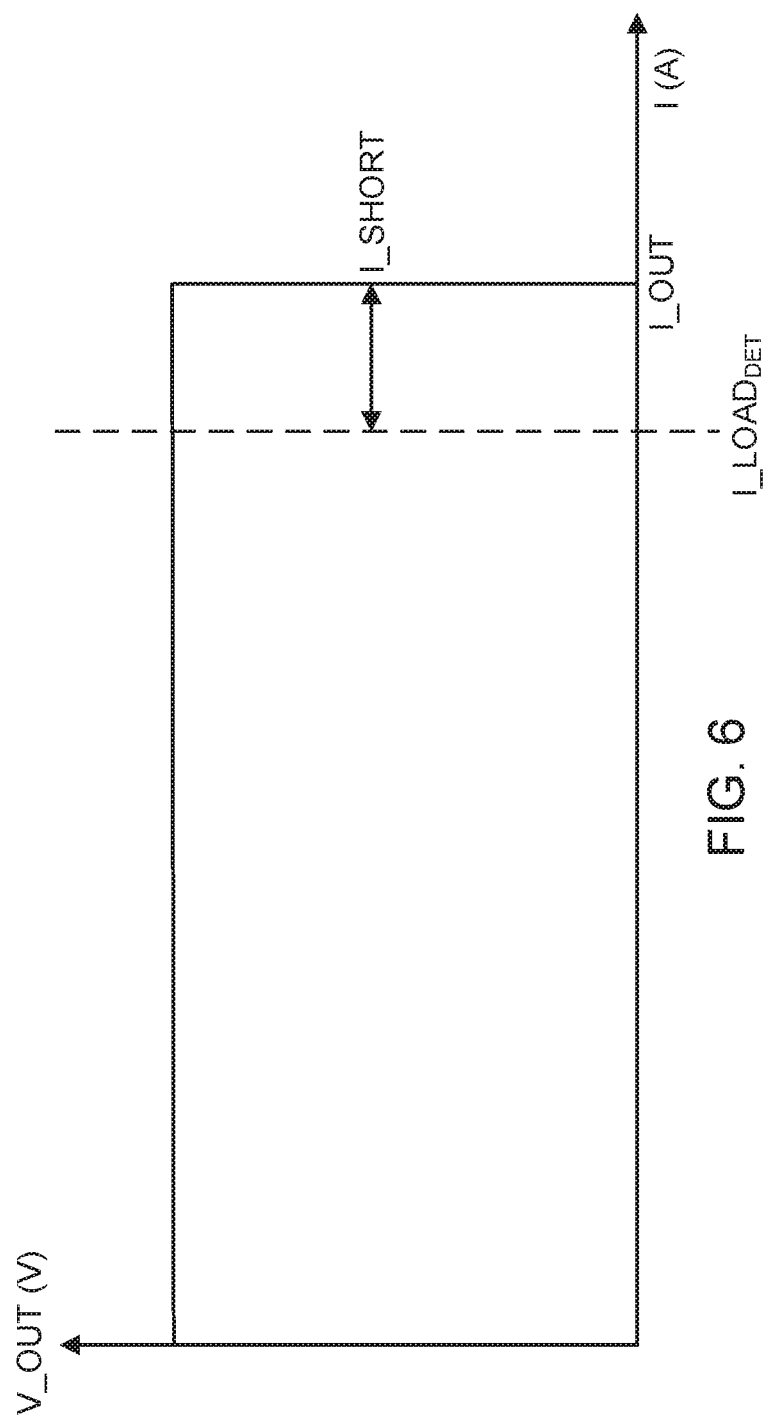
FIG. 6 is a voltage-current diagram illustrating an example of operation of the method of FIG. 5 in accordance with an aspect of the disclosure.

The transition point between a constant-voltage mode and a constant-current mode of operation is shown in FIG. 6. The constant-voltage mode (CV) keeps the output voltage V_OUT at the desired output voltage mode. Should the flyback converter not be able to force V_OUT to the desired level, operation ensues in a constant-current (CC) mode such that the output current equals I_OUT. The difference between I_OUT and $I\_LOAD_{DET}$ equals the soft-short current I_SHORT. Constant voltage and constant current modes (CV/CC) may be used in conjunction with each other to provide a regulated power source to a battery operated portable device. The CC mode control can be used in reverse to "hunt" for the I_OUT value needed to deliver $LLOAD_{DET}$ to the load, e.g., electronic device 101.

Figure 7:
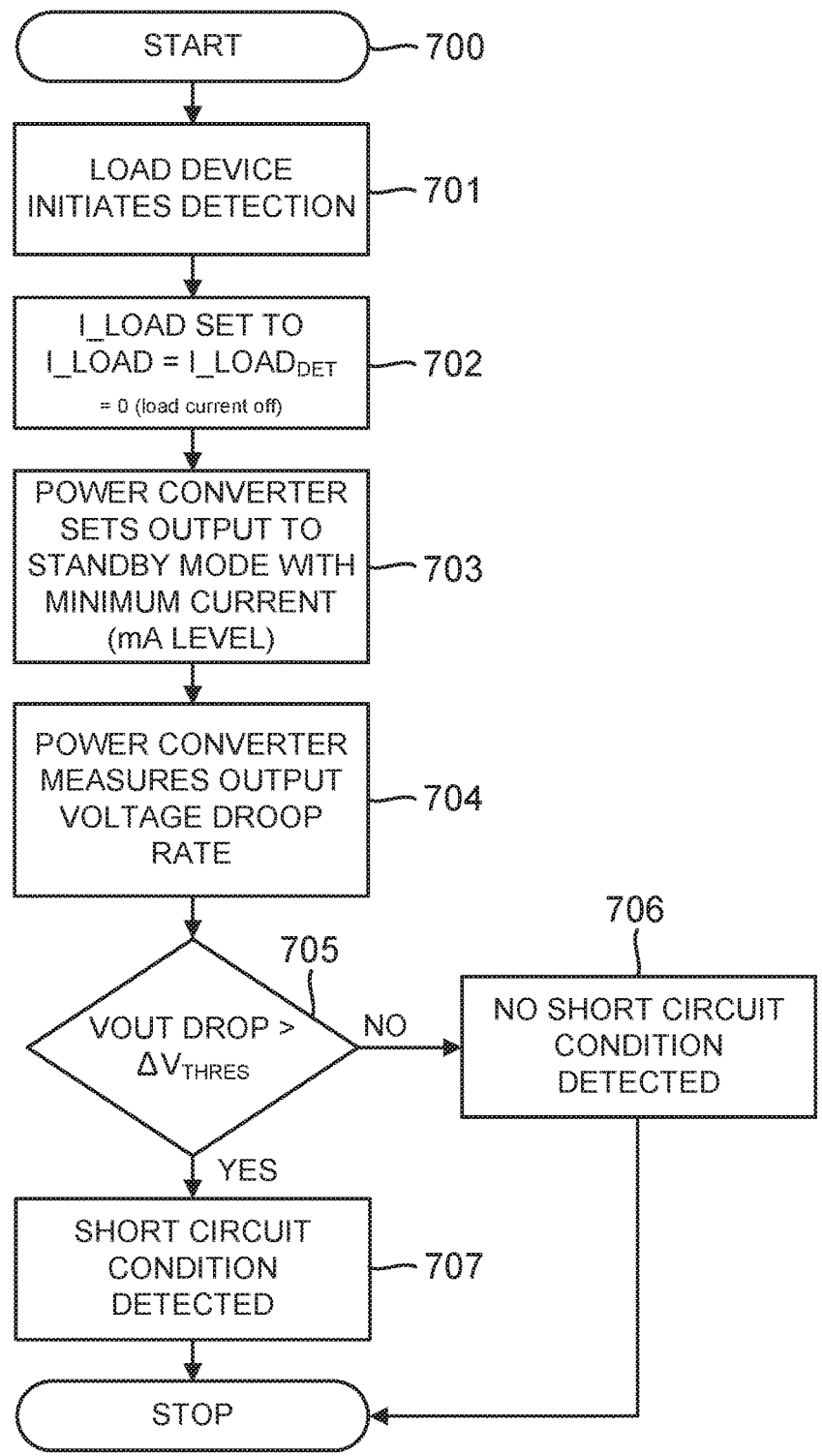
FIG. 7 is a flowchart of an example alternative method, in accordance with an aspect of the disclosure, of detecting a soft-short condition in a data cable driven by a switching power converter.

Note that the soft-short circuit current may be too low for the flyback converter to enter a constant-current mode at the corresponding I_OUT level. To detect such low levels of soft-short current, the output voltage V_OUT from the flyback converter may be tested for droop while the mobile device is disconnected or drawing zero current. An example flowchart for the resulting voltage droop method is shown in FIG. 7. In this method, the soft-short current is too small to force the flyback converter into the CC mode. The voltage droop method begins with an act 701 in which the load device initiates the voltage droop method such that its load current I_LOAD equals zero in an act 702. The flyback converter then enters a standby mode in an act 703 in which the minimum amount of current is driven into the data interface cable. The output voltage is driven to the desired V_OUT level in act 703, whereupon the cycling of the power switch ceases so that the droop rate of the output voltage may be measured in an act 704. The voltage droop in a set amount time is compared to a threshold value in an act 705. If the voltage droop does not exceed the threshold, no soft-short circuit condition is deemed to exist in an act 706. Conversely, if the voltage droop exceeds the threshold, a soft-short circuit condition is deemed to be detected in an act 707.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A flyback converter for charging a mobile device through a data interface cable, comprising:
a primary-side controller configured to regulate the cycling of a power switch in a constant-current mode;
a secondary-side controller configured to communicate through a data channel in the data interface cable with a load device to receive a value of a constant load current consumed by the load device during a soft-short circuit detection mode and configured to communicate a value of the constant load current to the primary-side controller, wherein the primary-side controller is configured to:
adjust the cycling of the power switch until the flyback converter enters the constant-current mode in which it drives a constant output current into the data interface cable while the load device consumes the constant load current;
measure the constant output current using a constant current coefficient; and
determine a difference between a measure of the constant output current and the value of the constant load current to detect a soft-short circuit current.

2. The flyback converter of claim 1, wherein the secondary-side controller is further configured to communicate the detection of the soft-short current to the load device through the data channel in the data interface cable.

3. The flyback converter of claim 1, wherein the primary-side controller is configured to detect the soft-short circuit current responsive to the difference between the measure of the constant output current and the value of the constant load current exceeding a soft-short circuit threshold.

4. The flyback converter of claim 1, wherein the primary-side controller is further configured to shut down the cycling of the power switch responsive to the detection of the soft-short circuit current.

5. The flyback converter of claim 1, wherein the constant load current equals zero, and wherein the secondary-side controller is configured to detect a soft-short circuit condition responsive to a voltage droop for an output voltage from the flyback converter exceeding a voltage droop threshold.

6. The flyback converter of claim 5, wherein the secondary-side controller is further configured to:
measure the output voltage droop in a standby mode that delivers zero current to the load;
compare the output voltage droop to the voltage droop threshold; and detect the soft-short circuit condition responsive to the comparison of the output voltage droop to the voltage droop threshold.

7. The flyback converter of claim 6, wherein the secondary-side controller is configured to reset the flyback converter responsive to a voltage droop rate being greater than the voltage droop threshold.

8. The flyback converter of claim 1, wherein the data interface cable is a USB cable.

9. A method of detecting a soft-short circuit, comprising:
at a secondary-side controller for a flyback converter, receiving a load current value for a constant load current to be drawn by a load device coupled to the flyback converter through a data interface cable;
communicating the load current value from the secondary-side controller to a primary-side controller for the flyback converter;
while the load device consumes the constant load current, adjusting a regulation of a power switch in the flyback converter by reducing a constant-current coefficient until the regulation is a constant-current regulation in which the flyback converter drives the data interface cable with a constant output current; and
comparing a difference between a measure of the constant output current and the load current value to a soft-short threshold to detect the soft-short circuit.

10. The method of claim 9, wherein adjusting the regulation of the power switch begins with a constant-current limit that is greater than the constant load current plus the soft-short threshold, and wherein the adjusting of the regulation of the power switch comprises reducing the constant-current limit until the regulation is the constant-current regulation.

11. The method of claim 9, wherein communicating the load current value from the secondary-side controller to the primary-side controller comprises communicating the load current value over an optoisolator.

12. The method of claim 9, wherein communicating the load current value from the secondary-side controller to the primary-side controller comprises pulsing a synchronous rectifier switch.

13. The method of claim 9, wherein communicating the load current value from the secondary-side controller to the primary-side controller comprises communicating the load current value over a capacitor.

14. The method of claim 9, further comprising switching off the flyback converter responsive to the detection of the soft-short circuit.

15. The method of claim 9, wherein the load device comprises a mobile telephone, the method further comprising alerting the mobile telephone of the soft-short circuit detection.

16. The method of claim 9, wherein the comparison of the difference between the measure of the constant output current and the value of the load current to a soft-short threshold is performed by the primary-side controller, the method further comprising the primary-side controller alerting the secondary-side controller of the detection of the soft-short circuit.

* * * * *